United States Patent
Ishii

[11] Patent Number: 5,851,298
[45] Date of Patent: Dec. 22, 1998

[54] SUSCEPTOR STRUCTURE FOR MOUNTING PROCESSING OBJECT THEREON

[75] Inventor: Nobuo Ishii, Yamanashi-ken, Japan

[73] Assignee: Tokyo Electron Limited, Tokyo, Japan

[21] Appl. No.: 790,426

[22] Filed: Jan. 29, 1997

[30] Foreign Application Priority Data

Feb. 1, 1996 [JP] Japan .................................. 8-038927

[51] Int. Cl.[6] ................................................ C23C 16/00
[52] U.S. Cl. ........................ 118/728; 156/345; 392/418; 219/464
[58] Field of Search .............................. 219/121.43, 385, 219/457, 464; 392/416, 418; 118/725, 728; 156/345; 204/298.15

[56] References Cited

U.S. PATENT DOCUMENTS

| | | | |
|---|---|---|---|
| 4,970,375 | 11/1990 | Schittenhelm et al. | 219/543 |
| 5,306,895 | 4/1994 | Ushikoshi et al. | 219/385 |
| 5,310,993 | 5/1994 | McWilliams et al. | 219/449 |
| 5,456,757 | 10/1995 | Aniga et al. | 118/723 E |
| 5,490,228 | 2/1996 | Soma et al. | 392/416 |
| 5,539,179 | 7/1996 | Nozawa et al. | 219/121.43 |
| 5,562,774 | 10/1996 | Breidenbach et al. | 118/715 |
| 5,566,043 | 10/1996 | Kawada et al. | 361/234 |

FOREIGN PATENT DOCUMENTS

| | | |
|---|---|---|
| 7-183277 | 7/1995 | Japan . |
| 8-130237 | 5/1996 | Japan . |

*Primary Examiner*—R.Bruce Breneman
*Assistant Examiner*—Luz Alejandro
*Attorney, Agent, or Firm*—Oblon,Spivak, McClelland, Maier & Neustadt, P. C.

[57] ABSTRACT

A susceptor structure of the present invention comprising a susceptor main body having a mount surface mounting a processing object thereon, an upper side layer formed by sintering a first inorganic nonmetallic material having thermal conductivity, a lower side layer formed by sintering a second inorganic nonmetallic material having thermal conductivity lower than the first inorganic nonmetallic material, and an intermediate layer formed between the upper and lower side layers to be sintered to be combined with these layers such that the first and second inorganic nonmetallic materials are sintered in a mixing state of the first and second inorganic nonmetallic materials as its component ratio is transited, a cooling section for supporting the susceptor main body from the lower side to cool the susceptor main body, an electrostatic chuck, buried in the susception main body, for absorbing the processing object on the mount surface by Coulomb force, and heater, buried in the susception main body, for heating the processing object mounted on the mount surface.

16 Claims, 6 Drawing Sheets

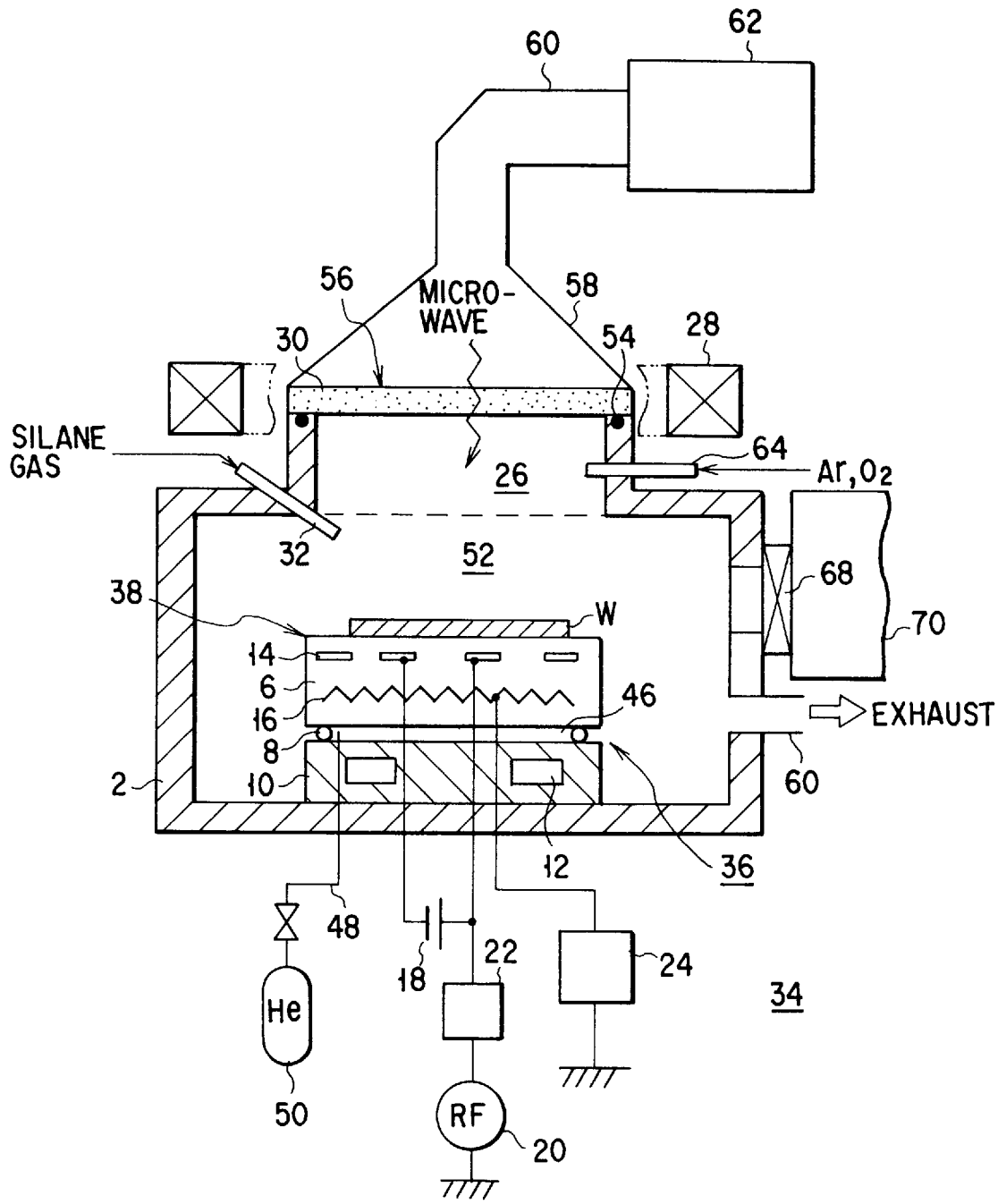
F I G. 1

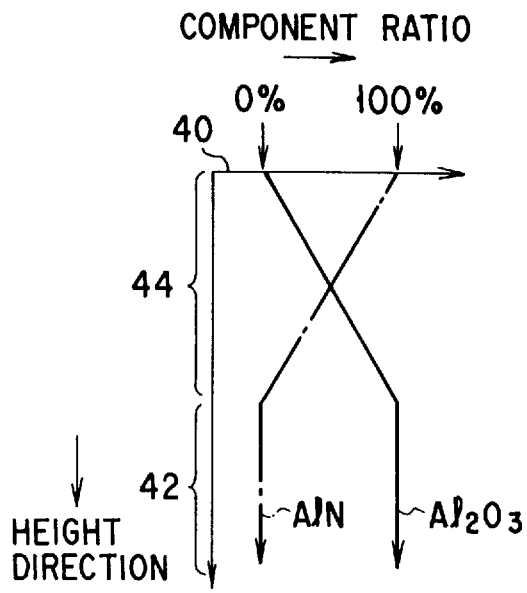
F I G. 4
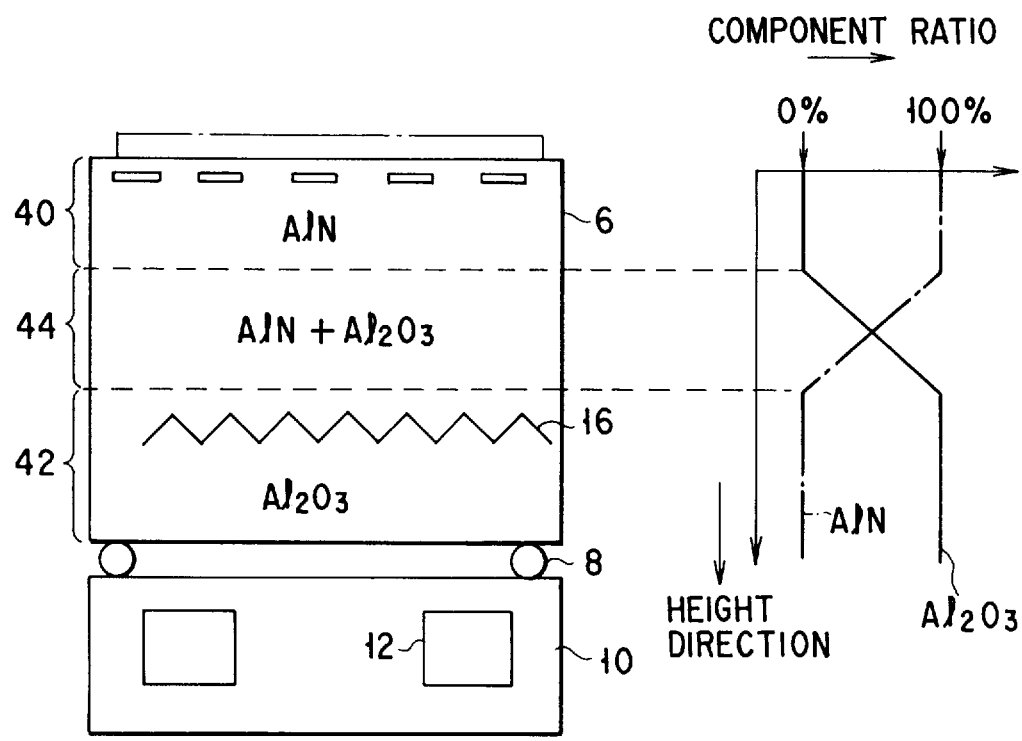
F I G. 5A
F I G. 5B

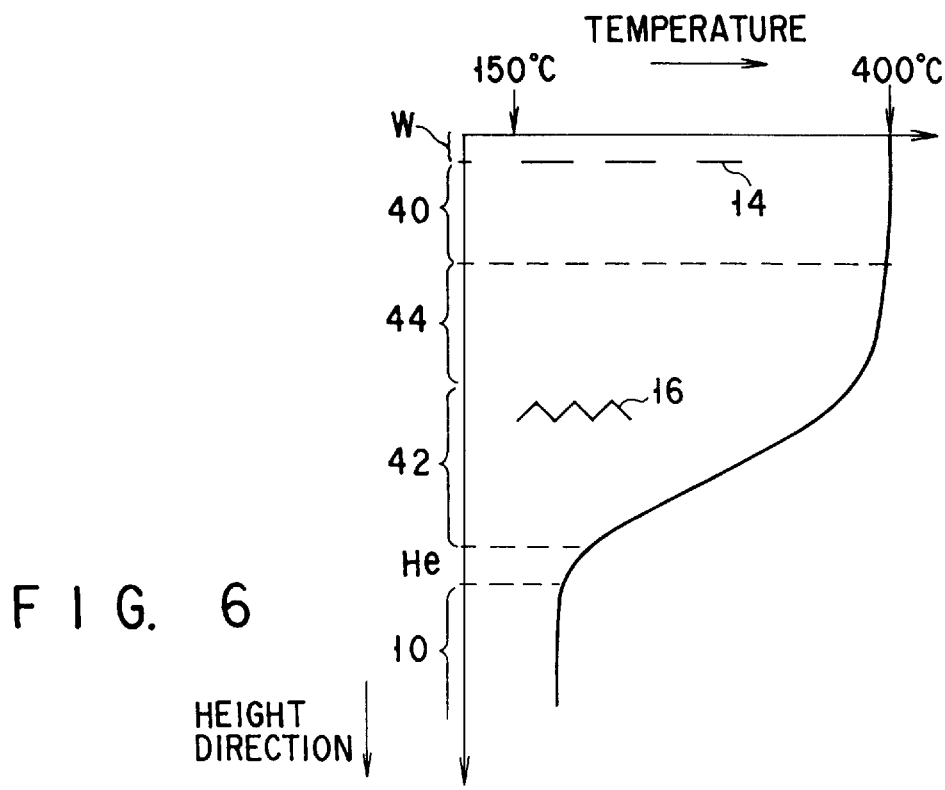
FIG. 6
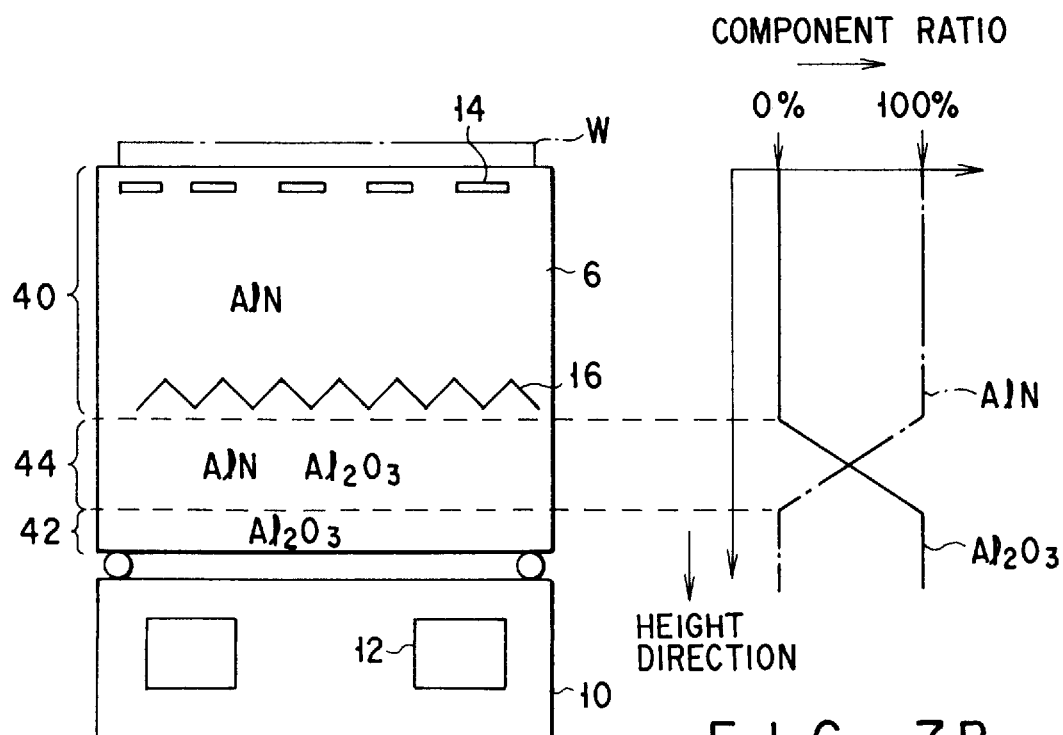
FIG. 7A
FIG. 7B

SUSCEPTOR STRUCTURE FOR MOUNTING PROCESSING OBJECT THEREON

BACKGROUND OF THE INVENTION

The present invention relates to a susceptor structure which is provided in a processing device for processing an object such as a semiconductor wafer, for mounting the processing object thereon.

In recent years, a plasma processing equipment using plasma has been frequently used for a process such as a film-forming, etching, ashing in a manufacturing process of a semiconductor product in accordance with high density and high fining of the semiconductor product.

FIG. 12 shows an example of a conventional processing device using plasma. In a processing equipment 100, an oxide film such as $SiO_2$ is formed on a semiconductor wafer W by using plasma. The processing equipment 100 comprises a processing container 2 where the semiconductor wafer W is processed. In the processing container 2, a susceptor structure 4 is provided to mount the semiconductor wafer W thereon and to support the semiconductor wafer W. The susceptor structure 4 comprises a susceptor body 6 as an upper portion structure, and a cooling section 10 as a lower portion structure for supporting the susceptor body 6 through a seal member 8 such as an O-ring. The entire cooling section 10 is formed of metallic material such as aluminum. To cool the susceptor body 6, the cooling section 10 has a cooling jacket 12 into which cooling water flows.

The entire susceptor body 6 is formed of a inorganic nonmetallic material sinter having a relative good thermal conductivity such as AlN (aluminum nitride) ceramics. In the susceptor body 6, an electrostatic chuck 14 for holding the wafer W by Coulomb force and a heater 16 for heating the wafer W are buried. The electrostatic chuck 14 is connected to a high tension direct current source 18 for generating Coulomb force. The electrostatic chuck 14 is also connected to a bias high frequency power supply 20 through a matching circuit 22. The heater 16 is connected to a heater source 24.

A ceiling section of the processing container 2 projecting upward is formed as an ECR (Electron Cycloton Resonance) chamber 26, which is surrounded by magnetic field generating means 28. To generate plasma due to electron cycloton resonance (ECR), a microwave is introduced to the ECR chamber 26 through a ceiling plate 30 formed of quartz glass. To form an oxide film on the wafer W, film-forming gas such as silane and oxygen is introduced to the processing container 2 through a gas nozzle 32. At the time of a film-forming process, the wafer W is heated by the heater 16 to be maintained at process temperature of about 200 to 250° C., and the cooling section 10 is cooled to 150° C. to prevent deterioration of its strength.

For doping the other elements such as fluorine other than the $SiO_2$ film, the process temperature is set to 400° C. or more since sufficient doping cannot be carried out at the process temperature of about 250° C. It is assumed that the thickness of the susceptor body 6 is set to be thin such as 15 to 20 mm at the request of miniaturizing the equipment. The temperature of the cooling section 10 is increased to surpass the threshold temperature of strength deterioration, which is the limit of the capacity of the cooling section, in spite of cooling with cooling water flowing to the cooling jacket 12. To solve this problem, it can be considered that the thickness of the susceptor body 6 is enlarged such that heat is not easily transmitted to the cooling section 10 from the heater 16 (that is, heat resistance is increased), or the capacity of the cooling jacket 12 is enhanced. However, these methods go against the request of miniaturizing the equipment. Or, according to these method, the temperature gradient to be added to aluminum, which constitutes the cooling section 10, becomes too large. This causes the problem of strength.

On the other hand, the surface potential of the wafer W considerably varies by the influence of plasma generated at the upper portion of the wafer W and a high frequency supplied to the electrostatic chuck 14. As a result, the generation of some degree of the potential difference between the surface of the wafer W and the heater 16 or the cooling section 10 is inevitable. The damage of the circuit element of the surface of the wafer W, which is caused by the potential difference, can be prevented by electrical insulating characteristic of AlN ceramics (susceptor body). In this case, AlN ceramics is provided between the surface of the wafer W and the heater 16 or the cooling section 10. However, AlN ceramics has a property in which the electrical insulating characteristic is deteriorated if the temperature is increased. Due to this, particularly, if the process temperature reaches 400° C., the electrical insulating characteristic of AlN ceramics provided between the surface of the wafer W and the heater 16 or the cooling section 10 is largely deteriorated. As a result, there is possibility that the circuit element on the surface of the wafer W will be damaged. Regarding the electrostatic chuck 14, the electrostatic chuck 14 is electrically floated relative to the direct current by a capacitor and the like. Due to this, it is unnecessary to consider the potential difference between the surface of the wafer W and the electrostatic chuck 14.

BRIEF SUMMARY OF THE INVENTION

An object of the present invention is to provide a susceptor structure suitable for miniaturizing an equipment, which can maintain an electrical insulating characteristic of a susceptor body even under a high process temperature so as to prevent a circuit element of a wafer surface from being damaged, and which can prevent temperature of a cooling section from being excessively increased by heat transmitted from a heater through the susceptor body so as to control deterioration of the strength of the cooling section.

The object of the present invention can be attained by the following susceptor structure.

More specifically, there is provided a susceptor structure comprising:

a susceptor main body having a mount surface mounting a processing object thereon, an upper side layer formed by sintering a first inorganic nonmetallic material having thermal conductivity, a lower side layer formed by sintering a second inorganic nonmetallic material having thermal conductivity lower than the first inorganic nonmetallic material, and an intermediate layer formed between the upper and lower side layers to be sintered to be combined with these layers such that the first and second inorganic nonmetallic materials are sintered in a mixing state of the first and second inorganic nonmetallic materials as its component ratio is transited;

a cooling section for supporting the susceptor main body from the lower side to cool the susceptor main body;

an electrostatic chuck, buried in the susceptor main body, for holding the processing object on the mount surface by Coulomb force; and heating means, buried in the susception main body, for heating the processing object mounted on the mount surface.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a cross-sectional view schematically showing the structure of a processing equipment having a susceptor structure of the present invention;

FIG. 4 is a view showing the other specific form of the component ratio of materials of the susceptor body forming the susceptor structure of FIG. 2A;

FIG. 5A is an enlarged view schematically showing the susceptor structure of a second embodiment of the present invention;

FIG. 5B is a view showing the transition of a component ratio of materials of a susceptor body forming the susceptor structure of FIG. 5A;

FIG. 6 is a view showing a temperature profile of the susceptor structure of FIG. 5A;

FIG. 7A is an enlarged view schematically showing the susceptor structure of a third embodiment of the present invention;

FIG. 7B is a view showing the transition of a component ratio of materials of a susceptor body forming the susceptor structure of FIG. 7A;

DETAILED DESCRIPTION OF THE INVENTION

The following will explain embodiments of the present invention with reference to the drawings.

Figure 12:
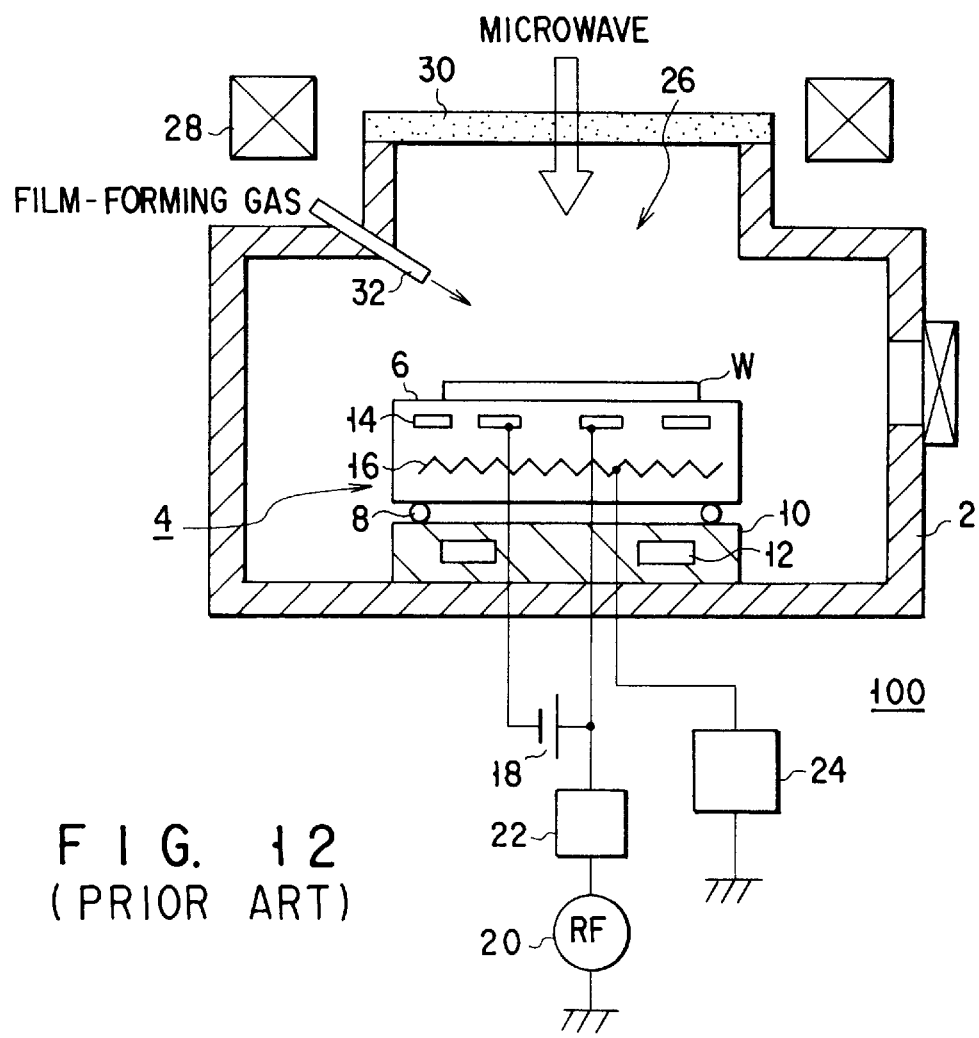
FIG. 12 is a cross-sectional view schematically showing the structure of a processing equipment having a conventional susceptor structure.

In consideration of the susceptor structure as shown in FIG. 12, it is desirable that the following all problems be solved.

(1) Temperature management

The temperature of the cooling section 10 can be prevented from being excessively increased by heat transmitted from the heater 16 through the susceptor body 6 as heating the wafer W efficiently, thereby controlling the deterioration of the strength of the cooling section 10.

(2) Device destruction

The electrical insulating characteristic of the susceptor body 6 can be maintained even under the high process temperature, thereby preventing the circuit element of the wafer surface from being damaged.

(3) Holding Means

A strong holding means can be ensured by the electrostatic chuck 14.

For example, for solving the third problem, that is, to obtain the a strong holding means by the electrostatic chuck 14, it is needed that the electrical insulating characteristic of the susceptor body 6 be reduced. However, if the electrical insulating characteristic of the susceptor body 6 is reduced, there is possibility that the circuit element of the surface of the wafer W will be damaged by the potential difference generated between the surface of the wafer W and the heater 16 or the cooling section 10. As a result, the second problem, that is, the device destruction cannot be solved. On the other hand, if the susceptor body 6 is formed of AlN ceramics having a good thermal conductivity to heat the wafer W efficiently, the temperature of the cooling section 10 is excessively increased by heat transmitted from the heater 16 through the susceptor body 6. As a result, since strength of the cooling section 10 is deteriorated, the first problem cannot be solved. In addition, since AlN ceramics has the property in which the electrical insulating characteristic is deteriorated if the temperature rises, the second problem, that is, the device destruction, cannot be solved. As mentioned above, these three problems should be solved under the conditions, which are reciprocal one another. If priority is given to one condition over the other conditions to solve one of three problems, conditions necessary to solve the other problem are abandoned.

Figure 10:
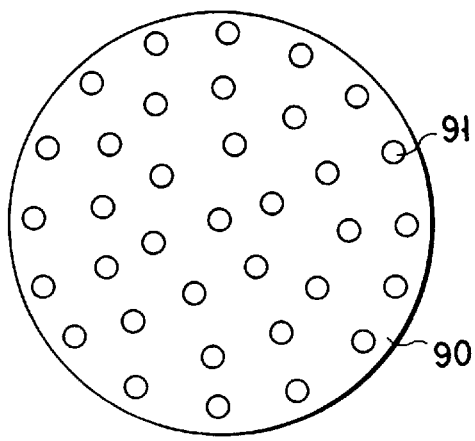
FIG. 10 is a plane view of an AlN plate forming the susceptor body.
Figure 11:
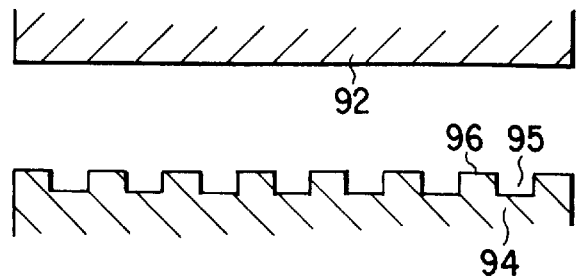
FIG. 11 is a partially cross-sectional view of the susceptor body showing a modification of the structure of FIG. 10.

To solve the above mentioned problems, the inventor of the present invention reached the idea of the structure of the susceptor body as shown in FIGS. 10 and 11.

FIG. 10 shows sheets 90 formed of AlN ceramics having a plurality of holes 91. These sheets 90 are superimposed on each other to be sintered, so that the susceptor body 6 can be formed. As a result, since the hole portions 91 having no AlN have poor thermal conductivity, the heat transmission to the cooling section 10 can be controlled to some degree as using the AlN characteristic having a good thermal conductivity. Also, even if the temperature of the AlN ceramics is increased so as to deteriorate the electrical insulating characteristic, the electrical insulating characteristic can be maintained at the hole portions 91 having no AlN. As a result, the device destruction can be extremely prevented.

FIG. 11 shows a modification of FIG. 10. In FIG. 11, a first plate 92 formed of a flat AlN ceramics, and a second plate 94 formed of AlN ceramics having concave and convex portions formed on its surface. The first and second plates 92 and 94 are superimposed on each other so as to be sintered, so that the susceptor body 6 is formed. In this structure, spaces are formed by concave portions 95 when convex portions 96 of the second plate 94 contact the first plate 92. These spaces can bring about the same effect as the holes 91 of FIG. 10.

However, in the susceptor shown in FIGS. 10 and 11, the temperature distribution becomes uneven at the holes 91

(concave portions 95). Moreover, it takes much time to form holes 91 (concave and convex portions 95 and 96) and to sinter the plates.

To solve the above problem, the inventor of the present invention reached the proposal of the susceptor structure set forth below. The following will specifically explain the novel susceptor structure.

FIG. 1 shows an ECR plasma CVD equipment as a processing equipment. As shown in FIG. 1, a processing equipment 34 has a processing container 2, which is cylindrically formed of, e.g., aluminum. On the bottom portion of the processing container 2, for example, an aluminum susceptor structure 36 is provided. On the susceptor structure 36, the wafer W to be processed is mounted. The susceptor structure 36 comprises the susceptor body 6 as the upper portion structure, and the cooling section 10 as the lower portion structure for supporting the susceptor body 6 through the seal member 8 such as the O-ring. The entire cooling section 10 is formed of material having a good thermal conductivity such as aluminum. To cool the susceptor body 6, the cooling section 10 has the cooling jacket 12 into which cooling water flows as coolant.

In the susceptor body 6, the bipolar electrostatic chuck 14 and the heater 16 are buried. The electrostatic chuck 14 is used to absorb the wafer W by Coulomb force. The heater 16 heats the wafer W. The electrostatic chuck 14 is connected to the high tension direct current source 18, which applies the high tension d.c. voltage to the electrostatic chuck 14 for generating Coulomb force. The electrostatic chuck 14 is also connected to the bias high frequency power supply 20 of, e.g., 13.56 MHz through the matching circuit 22. The heater 16 is connected to a heater source 24.

To ensure thermal conductivity between the susceptor body 6 and the cooling section 10, a space 46 is filled with heat conductive gas (helium gas). The space 46 is formed between the susceptor body 6 and the cooling section 10 and is airtightly sealed up by the seal member 8. Helium gas is supplied to the space 46 through a gas introduction pipe 48. The gas introduction pipe 48 is connected to a helium gas source 50 filled with helium gas.

The processing container 2 is formed such that the upper portion is narrowed stepwise. Thereby, the processing container 2 is divided into the ECR chamber 26 of the upper side and a reaction chamber 52 of the lower side. The ECR chamber 26 is surrounded by ring-shape magnetic field generating means such as an electromagnetic coil 28. The ECR chamber 26 has an opening on its ceiling section. The opening is closed by the ceiling plate 30, which forms a microwave introduction window 56. The microwave introduction window 56 (ceiling plate 30) is formed of a dielectric member such as quartz glass ($SiO_2$) through which the microwave is passed. The microwave introduction window 56 is airtightly attached to the processing container 2 through a seal member 54 such as an O-ring. A conical taper waveguide 58 is connected to the microwave introduction window 56. To introduce the microwave to the ECR chamber 26, the taper waveguide 58 is connected to a microwave generator 62 of, e.g., 2.45 GHz through a waveguide 60 having a rectangular cross section. Therefore, a downward magnetic field is formed by the electromagnetic coil 28 in the ECR chamber 26 and the reaction chamber 52. As a result, an ion is effectively confined, and electron cyclotron resonance is generated by the magnetic field and the microwave introduced to the ECR chamber 26.

To introduce plasma gas such as Ar gas or $O_2$ gas into the ECR chamber 26, a gas introduction nozzle 64 is formed on the side wall of the processing container 2 forming the ECR chamber 26. To introduce process gas into the reaction chamber 52, the gas nozzle 32 is formed on the side wall of the processing container 2 forming the reaction chamber 52. The gas nozzle 32 introduces, for example, silane gas as process gas. An exhaust port 60 is formed on the side wall of the bottom portion of the processing container 2 such that the interior of the processing container 2 can be drawn a vacuum. The exhaust port 60 is connected to a vacuum pump (not shown). Moreover, a load lock chamber 70 is connected to the side wall of the processing container 2 through a gate valve 68.

Figures 2A, 2B:
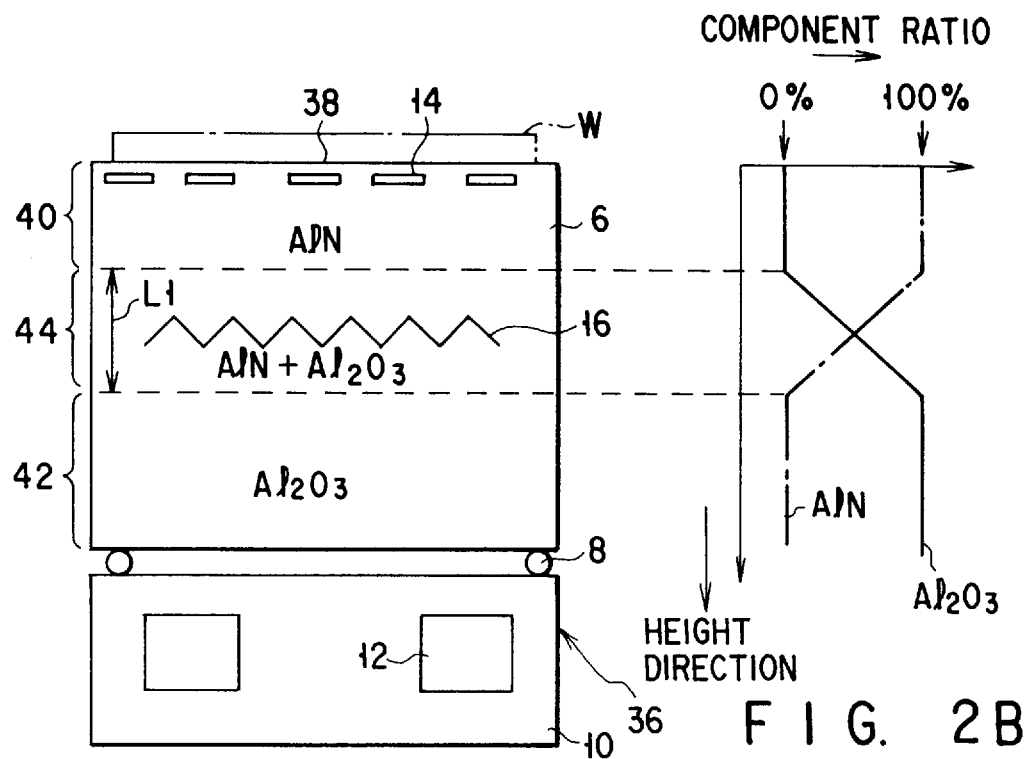
FIG. 2A is an enlarged view schematically showing the susceptor structure of a first embodiment of the present invention.
FIG. 2B is a view showing the transition of a component ratio of materials of a susceptor body forming the susceptor structure of FIG. 2A.

As shown in FIG. 2A, the susceptor body 6 of the susceptor structure 36 of the first embodiment of the present invention comprises three layers 40, 42, 44, which are sintered to be integral with each other. The thickness of the susceptor body 6 is set to about 15 to 20 mm. The first layer 40, which is placed at the uppermost position to form a mounting surface 38, is formed of a sintering material of non-organic and non-metallic material having a relatively good thermal conductivity, such as AlN ceramics. The electrostatic chuck 14 is buried in the first layer 40. The third layer 42, which is placed at the lowermost position, is formed of a sintering material of non-organic and non-metallic material, such as $Al_2O_3$ ceramics. The thermal conductivity of the sintering material is smaller than the AlN ceramics. Also, the deterioration of the electrical insulating characteristic of the sintering material is low even under high temperature. $Si_3N_4$ ceramics may be used in place of $Al_2O_3$ ceramics.

The second layer 44, which is placed between the first and third layers 40 and 42, is formed of a sintering material of AlN ceramics and $Al_2O_3$ ceramics to have a predetermined thickness L1. In the second layer 44, as shown in FIG. 2B, the component ratio of AlN ceramics to $Al_2O_3$ ceramics is linearly transited so that a mixing state is set. More specifically, the second layer 44 is not formed by simply bonding AlN ceramics to $Al_2O_3$ ceramics with adhesive. In other words, AlN ceramics and $Al_2O_3$ ceramics are sintered to be combined with each other as the composition ratio of these two kinds of ceramics is transited little by little. Specifically, the content of AlN ceramics becomes higher toward the upper side, and the content of ceramics and $Al_2O_3$ ceramics becomes higher toward the lower side. In the second layer 44, the heater 16 is buried.

Next, the operation of the processing equipment 34 having the above-structured susceptor structure 36 will be explained as follows.

First, after the processing container 2 is tightly sealed up, the interior of the processing container 2 is drawn a vacuum so as to have a predetermined degree of vacuum. Thereafter, an unprocessed semiconductor wafer W is transferred from the load lock chamber 70 to the processing container 2 to be mounted on the mounting surface 38 of the susceptor body 6. At this time, the semiconductor wafer W is held onto the mounting surface 38 by Coulomb force of the electrostatic chuck 14. Under this state, plasma gas such as Al gas, $O_2$ gas is introduced to the ECR chamber 26 through the gas introduction nozzle 64. Also, silane gas, serving as process gas, and fluorine gas, serving as dope gas, are introduced to the reaction chamber 52 through the gas introduction nozzle 32. As a result, the interior of the processing container 2 is maintained to have predetermined process pressure, e.g., about 1 mTorr (separately from the gas introduction nozzle 32, a dope gas introduction nozzle, which is dedicated to introduce fluorine gas as dope gas, may be provided in the processing container 2). At the same time, the microwave generated from the microwave generator 62 is introduced to the ECR chamber 26 from the microwave introduction window 56 through the rectangular waveguide 60 and the taper waveguide 58. As a result, the electromagnetic coil 28 is driven, so that a magnetic field of, e.g., about 700 to 1000 gauss is formed in the processing container 2. If the electron cyclotron resonance is generated by the interaction of the microwave introduced to the ECR chamber 26 with the magnetic field formed in the processing container 2, argon gas and oxygen gas are made to be plasma in the ECR chamber 26. An ion generated by the formation of plasma is supplied to the reaction chamber 52 along the downward magnetic field. By plasma energy supplied to the reaction chamber 52, silane gas introduced to the reaction chamber 52 is activated to react on the surface of the wafer W. Moreover, the surface of the wafer W is sputtered with Ar ion, a $SiO_2$ film doped with fluorine gas is formed on the surface of the wafer W.

In the above-mentioned film-formation process, the wafer W is heated at about 400° C. by heat due to plasma and heat from the heater 16. The heat due to plasma and heat from the heater 16 is transmitted to the lower portion of the susceptor body 6 by thermal conductivity so as to heat the cooling section 10 cooled by the cooling jacket 12. In the susceptor body 6, as shown in FIG. 2A, the first layer 40 is formed of AlN ceramics having a good thermal conductivity, and the third layer 42 is formed of $Al_2O_3$ ceramics whose thermal conductivity is smaller than the AlN ceramics. Due to this, the cooling section 10 can be prevented from being excessively heated.

Figure 3:
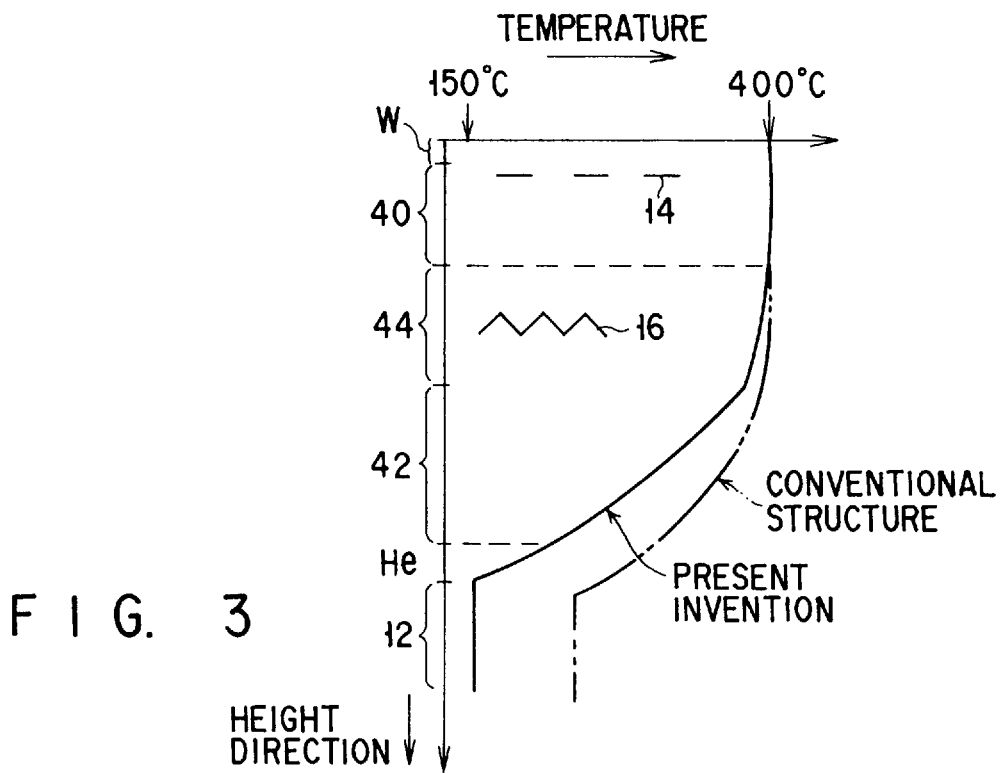
FIG. 3 is a view showing a temperature profile of the susceptor structure of FIG. 2A.

FIG. 3 shows a temperature profile along the height direction of the susceptor structure 36.

Since much $Al_2O_3$ ceramics having low thermal conductivity exists in the lower side of the second layer 44 in which the heater 16 is buried, the temperature gradient becomes extremely large at the portion lower than the heater 16, so that the temperature is rapidly reduced. Specifically, for example, the temperature in the vicinity of the upper portion of the cooling section 10, is about 150° C. In FIG. 3, for the comparison between the present invention and the conventional case, the temperature profile in the conventional device (the entire susceptor 6 is formed of AlN ceramics) is shown by a two-dot chain line.

As explained above, according to the susceptor structure 36 of this embodiment, the temperature rise of the cooling section 10 can be controlled by $Al_2O_3$ ceramics ($Si_3N_4$ ceramics) having low thermal conductivity even under the high process temperature. As a result, the deterioration of the strength of the cooling section 10 can be prevented, and the plasma CVD processing can be stably carried out at high temperature.

Moreover, the portion of the second layer 44 having the high content of AlN and the first layer 40 formed of AlN ceramics having good thermal conductivity exist at the upper side of the heater 16. As a result, the thermal conductivity from the heater 16 to the wafer W is improved, and the wafer W is efficiently heated.

In the susceptor structure 36 of this embodiment, the ceramic layer 44 containing $Al_2O_3$ having the small deterioration of electrical insulation exists on the upper side of the heater 16. As a result, the electrical insulation between the heater 16 and the surface of the wafer W can be maintained by the ceramic layer 44 even under the high process temperature. Even the surface potential of the wafer W varies, no electrical damage is given to the wafer W.

Also, in the susceptor structure 36 of this embodiment, the second ceramic layer 44 is not formed by simply adhering AlN ceramics to $Al_2O_3$ ceramics by adhesive. That is, AlN ceramics and $Al_2O_3$ ceramics are sintered to be combined with each other as the composition ratio of these two kinds of ceramics is transited little by little. As a result, since there is no room for allowing large heat resistance to enter due to insufficient adherence, heat and cooling can be efficiently carried out.

According to this embodiment, as shown in FIG. 2B, the composition ratio of the AlN ceramics to $Al_2O_3$ ceramics in the second layer 44 is linearly transited. However, this showed only one example. The composition ratio may be curvedly or stepwise transited. The width L1 of the second layer 44 and widths of the first and third layers 40 and 42 are suitably selected in the range that the cooling section 10 is excessively heated (e.g., the surface temperature of the cooling section 10 does not exceed 150° C.) and the electrical insulation between the heat 16 and the wafer W is sufficiently ensured. Moreover, in the above-mentioned embodiment, only the second layer 44 in which the heater 16 is buried was formed as the layer where the AlN ceramics and $Al_2O_3$ ceramics are mixed. However, the present invention is not limited to this embodiment. As shown in FIG. 4, all upper side of the third layer 42 may be used as the second layer 44 where the composition ratio of the AlN ceramics to $Al_2O_3$ ceramics is linearly transited. In this case, only the mount surface 38 may be used as the first layer 40. Thus, according to the above-mentioned structure, though the thermal conductivity to the wafer W from the heater 16 is slightly deteriorated, the electrical insulation between the heater 16 and the wafer W can be improved.

FIGS. 5A and 5B show the susceptor structure according to the second embodiment of the present invention.

As shown in the figures, in the susceptor structure of this embodiment, the heater 16 is buried in the third layer 42 of the susceptor body 6. The other structure is the same as the first embodiment.

According the above-mentioned structure, as shown in the temperature profile of FIG. 6, the temperature gradient at the lower portion of the heater 16 is slightly smaller than the first embodiment, and the drop amount of the temperature is slightly smaller. However, the electrical insulation between the heater 16 and the wafer W can be largely improved.

FIGS. 7A and 7B show the susceptor structure according to the third embodiment of the present invention.

As shown in the figures, in the susceptor structure of this embodiment, the heater 16 is buried in the first layer 40 of the susceptor body 6. The other structure is the same as the first embodiment.

Figure 8:
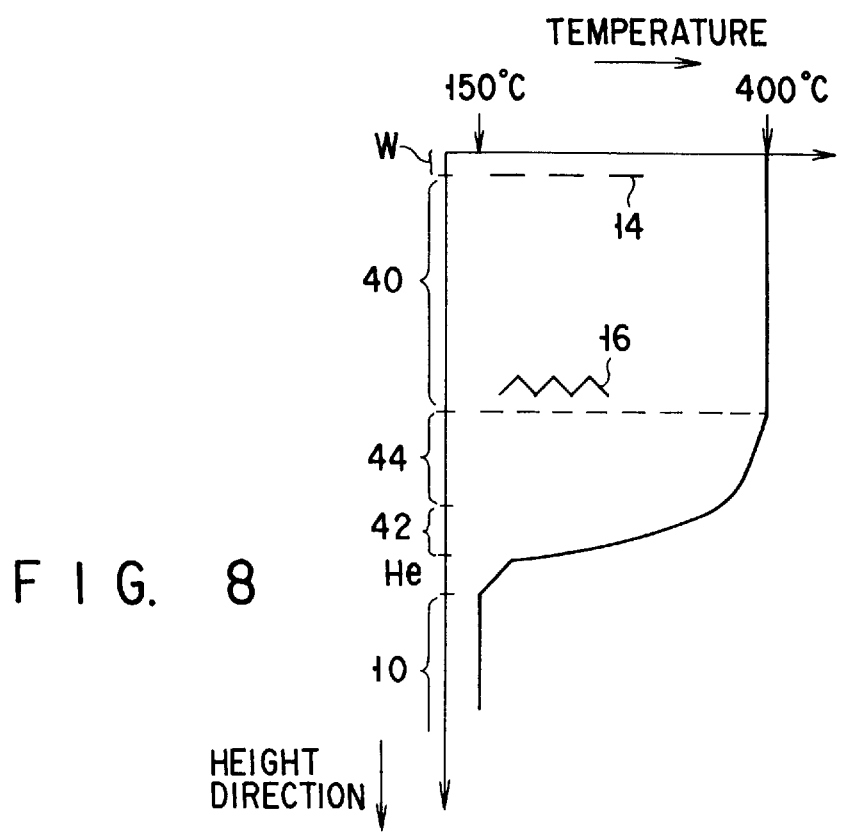
FIG. 8 is a view showing a temperature profile of the susceptor structure of FIG. 7A.

According the above-mentioned structure, the electrical insulation between the heater 16 and the wafer W is slightly reduced. However, as shown in the temperature profile of FIG. 8, since the temperature gradient at the lower portion of the heater 16 become larger, the temperature rise of the cooling section 10 can be largely controlled, and the deterioration of durability of the cooling section 10 can be surely prevented. In this case, to prevent the electrical insulation of the first layer 40 from being deteriorated, an appropriate amount of $Al_2O_3$ may be contained in the AlN ceramics forming the first layer 40.

Figures 9A, 9B:
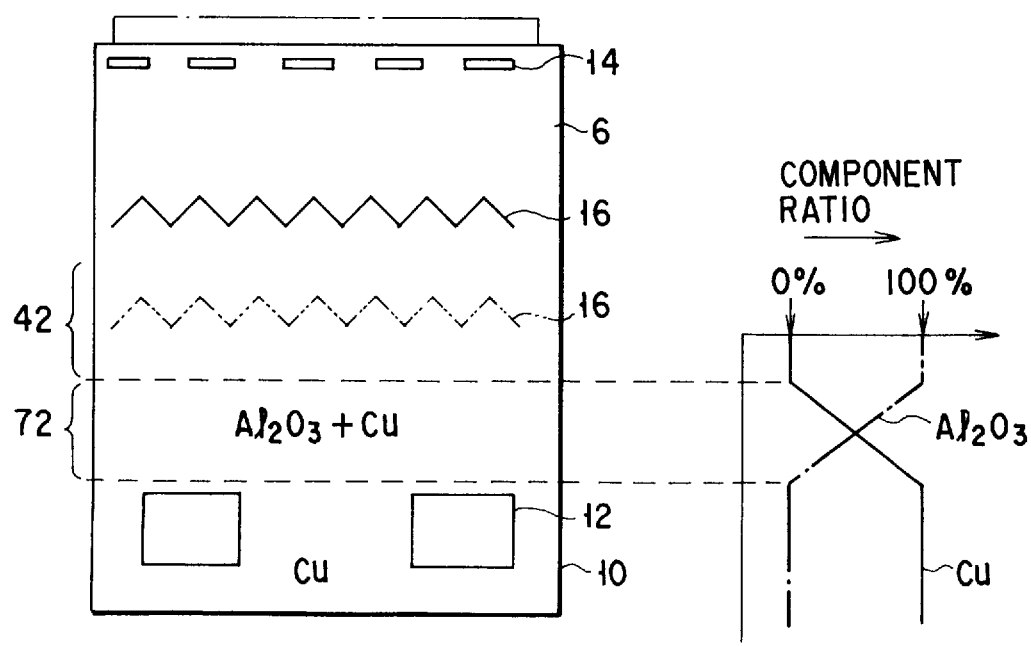
FIG. 9A is an enlarged view schematically showing the susceptor structure of a fourth embodiment of the present invention.
FIG. 9B is a view showing the transition of a component ratio of materials of a susceptor body forming the susceptor structure of FIG. 9A.

FIGS. 9A and 9B show the susceptor structure according to the fourth embodiment of the present invention.

As shown in FIG. 9A, in the susceptor structure of this embodiment, the cooling section 10 is formed of not aluminum but metallic material having a melting point, which is higher than the sintering temperature of the AlN ceramics and the $Al_2O_3$ ceramics (e.g., about 1200° C.), for example, copper. The cooling section 10 is sintered to be combined with the third layer 42 forming the lower side of the susceptor body 6 through a fourth layer 72. In the fourth layer 72, as shown in FIG. 9B, the composition ratio of $Al_2O_3$ to copper is linearly transited to be in a mixing state. More specifically, the content of copper is increased toward the side of the cooling section 10. The other structure is the same as the first to third embodiment.

In the structure in which the susceptor body 6 and the cooling section 10 are formed to be combined with each other, it is unnecessary to provide the supply system for gas for thermal conductivity such as He gas (for example, gas introduction pipe 48 of FIG. 1 or the helium gas source 50). As a result, the structure of the equipment itself can be simplified.

To sinter the third layer 42 and the cooling section 10 to be combined with each other as the composition ratio is gradually transited, it is needed that the melting temperature of the material forming the cooling section 10 is higher than the sintering temperature of AlN ceramics and $Al_2O_3$ ceramics.

Each of the embodiments explained the case in which the susceptor structure of the present invention is applied to the plasma CVD. However, the present invention is not limited to this case. It is, of course, that the susceptor structure can be applied to a plasma etching equipment, a plasma ashing equipment, a plasma sputtering equipment, and the other processing equipment no using plasma.

Additional advantages and modifications will readily occur to those skilled in the art. Therefore, the invention in its broader aspects is not limited to the specific details, and representative embodiments shown and described herein. Accordingly, various modifications may be made without departing from the spirit or scope of the general inventive concept as defined by the appended claims and their equivalents.

I claim:

1. A susceptor structure comprising:
    a susceptor main body having a mount surface capable of mounting a processing object thereon, comprising,
        an upper side layer formed by sintering a first inorganic nonmetallic material having thermal conductivity,
        a lower side layer formed by sintering a second inorganic nonmetallic material having thermal conductivity lower than said first inorganic nonmetallic material, and
        an intermediate layer formed between said upper and lower layers, wherein said first and second inorganic nonmetallic materials are sintered together so that a component ratio of said first and second inorganic nonmetallic materials between said upper and lower side layers is transited;
    a cooling section for supporting said susceptor main body from a lower side of the susceptor main body to cool the susceptor main body;
    an electrostatic chuck, buried in the susceptor main body, for holding the processing object on the mount surface by Coulomb force; and
    heating means, buried in the susceptor main body, for heating the processing object mounted on the mount surface.

2. The susceptor structure according to claim 1, wherein a content of the first inorganic nonmetallic material in said intermediate layer increases toward the upper side layer and a content of the second inorganic nonmetallic material increases toward the lower side layer.

3. The susceptor structure according to claim 1, wherein said heating means is buried in said intermediate layer.

4. The susceptor structure according to claim 1, wherein said heating means is buried in said upper side layer.

5. The susceptor structure according to claim 1, wherein said heating means is buried in said lower side layer.

6. The susceptor structure according to claim 1, wherein said first inorganic nonmetallic material consists of AlN, and said second inorganic nonmetallic material consists of either $Al_2O_3$ or $Si_3N_4$.

7. The susceptor structure according to claim 1, wherein said cooling section is formed of a metallic material having a melting temperature higher than sintering temperature of first and second inorganic nonmetallic materials, and the cooling section is sintered to be combined with the lower side layer.

8. The susceptor structure according to claim 7, wherein said cooling section is sintered to be combined with said lower side layer through a connecting layer formed by sintering the second inorganic nonmetallic material and copper in a mixing state of said second inorganic nonmetallic material and copper as its component ratio is transited.

9. The susceptor structure according to claim 8, wherein a content of said second inorganic nonmetallic material in said connecting layer increases toward the lower side layer and a content of copper increases toward the cooling section.

10. A susceptor structure comprising:
    a susceptor main body having a mount surface capable of mounting a processing object thereon, comprising,
        an upper side layer including a first inorganic nonmetallic material having thermal conductivity, and
        a lower side layer including a second inorganic nonmetallic material having thermal conductivity lower than said first inorganic nonmetallic material, wherein said first and second inorganic nonmetallic materials are sintered together so that a component ratio of said first and second inorganic nonmetallic materials between said upper and lower side layers is transited;
    a cooling section for supporting said susceptor main body from a lower side of the susceptor main body to cool the susceptor main body;
    an electrostatic chuck, buried in the susceptor main body, for holding the processing object on the mount surface by Coulomb force; and
    heating means, buried in the susceptor main body, for heating the processing object mounted on the mount surface.

11. The susceptor structure according to claim 10, wherein a content of the first inorganic nonmetallic material in said upper side layer increases toward the mount surface side, and a content of the second inorganic nonmetallic material increases toward the lower side layer.

12. A processing equipment comprising:
    a processing container for processing an object; and
    a susceptor structure, provided in said processing container, mounting the object thereon,
    wherein said susceptor structure comprises:
        a susceptor main body having a mount surface capable of mounting a processing object thereon, comprising,
            an upper side layer formed by sintering a first inorganic nonmetallic material having thermal conductivity,
            a lower side layer formed by sintering a second inorganic nonmetallic material having thermal conductivity lower than said first inorganic nonmetallic material, and an intermediate layer formed between said upper and lower layers, wherein said first and second inorganic nonmetallic materials are sintered together so that a component ratio of said first and second inorganic nonmetallic materials between said upper and lower side layers is transited;

a cooling section for supporting said susceptor main body from a lower side of the susceptor main body to cool the susceptor main body;

an electrostatic chuck, buried in the susceptor main body, for holding the processing object on the mount surface by Coulomb force; and heating means, buried in the susceptor main body, for heating the processing object mounted on the mount surface.

13. A susceptor structure comprising:

a susceptor main body having, on an upper surface thereof, a mount surface capable of mounting a processing object thereon, said susceptor main body comprising a first inorganic nonmetallic material having a first thermal conductivity and a second inorganic nonmetallic material having a second thermal conductivity which is lower than said first thermal conductivity, wherein a content of the first inorganic nonmetallic material is greater in an upper portion than in a lower portion of said susceptor main body, and a content of said second inorganic nonmetallic material is greater in the lower portion than in the upper portion of said susceptor main body;

a cooling section for supporting said susceptor main body from a lower side of the susceptor main body to cool the susceptor main body;

an electrostatic chuck buried in the susceptor main body, for holding the processing object on the mount surface by Coulomb force; and heating means buried in the susceptor main body, for heating the processing object mounted on the mount surface.

14. A susceptor structure according to claim 13, wherein:

said content of said first inorganic nonmetallic material in said susceptor main body gradually increases toward said upper surface of said susceptor main body in at least a portion of said susceptor main body and said content of said second inorganic nonmetallic material gradually increases toward a lower side of said susceptor main body in at least a portion of said susceptor main body.

15. A susceptor structure according to claim 13, wherein said susceptor main body comprises:

an upper side layer where said first inorganic nonmetallic material is dominant;

a lower side layer where said second inorganic nonmetallic material is dominant; and an intermediate layer interposed between said upper side layer and said lower side layer, wherein, in said intermediate layer, said content of said first inorganic nonmetallic material increases toward said upper side layer and said content of said second inorganic nonmetallic material increases toward said lower side layer.

16. A susceptor structure comprising:

a susceptor main body having, on an upper surface thereof, a mount surface capable of mounting a processing object thereon, said susceptor main body comprising a first inorganic nonmetallic material having a first thermal conductivity and a second inorganic nonmetallic material having a second thermal conductivity which is lower than said first thermal conductivity, wherein a content of the first inorganic nonmetallic material is greater in an upper portion than in a lower portion of said susceptor main body, and a content of said second inorganic nonmetallic material is greater in the lower portion than in the upper portion of said susceptor main body;

a cooling section for supporting said susceptor main body from a lower side of the susceptor main body to cool the susceptor main body; and heating means buried in the susceptor main body, for heating the processing object mounted on the mount surface.

* * * * *